(12) United States Patent
Hachitani

(10) Patent No.: US 7,170,154 B2
(45) Date of Patent: Jan. 30, 2007

(54) GLASS FOR WINDOW OF SEMICONDUCTOR PACKAGE, GLASS WINDOW FOR SEMICONDUCTOR PACKAGE, PROCESS FOR PRODUCTION OF GLASS WINDOW, AND SEMICONDUCTOR PACKAGE

(75) Inventor: Yoichi Hachitani, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 10/820,142

(22) Filed: Apr. 8, 2004

(65) Prior Publication Data
US 2004/0212060 A1    Oct. 28, 2004

(30) Foreign Application Priority Data
Apr. 9, 2003   (JP) .............................. 2003-105037

(51) Int. Cl.
*H01L 23/02* (2006.01)
(52) U.S. Cl. .................... 257/680; 257/704; 438/116
(58) Field of Classification Search ................ 257/680, 257/681, 431, 432, 434, 433, 679, 704, 794; 438/25, 116
See application file for complete search history.

(56) References Cited

U.S. PATENT DOCUMENTS

| | | | |
|---|---|---|---|
| 4,326,214 A * | 4/1982 | Trueblood .................. 257/681 |
| 5,045,509 A * | 9/1991 | Kiefer ......................... 501/59 |
| 5,188,990 A * | 2/1993 | Dumesnil et al. ............. 501/19 |
| 5,277,946 A * | 1/1994 | Nagai et al. ................. 428/426 |
| 6,072,232 A * | 6/2000 | Li et al. ....................... 257/680 |
| 6,426,311 B1 * | 7/2002 | Goto et al. ..................... 501/4 |
| 6,794,058 B2 * | 9/2004 | Honda et al. ................ 428/620 |
| 6,831,029 B2 * | 12/2004 | Chacon et al. ................. 501/66 |
| 6,847,761 B2 * | 1/2005 | Hamanaka .................... 385/33 |

FOREIGN PATENT DOCUMENTS

| | | | |
|---|---|---|---|
| JP | 8-306894 A | | 11/1996 |
| JP | 2000-86281 | * | 3/2000 |
| JP | 2002-198504 | * | 7/2002 |

* cited by examiner

*Primary Examiner*—S. V. Clark
(74) *Attorney, Agent, or Firm*—Nixon & Vanderhye P.C.

(57) ABSTRACT

Provided are a glass for a window which glass is suitably fitted to a semiconductor package made of a plastic and a glass window for the semiconductor package which glass window has various functions, the glass (1) being for use as a window material for a semiconductor package made of a plastic and having an average linear expansion coefficient of $120 \times 10^{-7}/°C.$ to $180 \times 10^{-7}/°C.$ at a temperature of 100 to 300° C., or (2) the glass having the above average linear expansion coefficient and having a U content of 5 ppb or less and a Th content of 5 ppb or less, and the glass window (a) being formed of the above glass for a window, (b) having the function of a lens and the above average linear expansion coefficient, or being formed of a glass (c) having the above average linear expansion coefficient and having a U content of 5 ppb or less and a Th content of 5 ppb or less and containing Cu and phosphorus oxide, the glass window being capable of exhibiting a transmittance of 50% at a wavelength of 630 nm or less in terms of a spectral transmittance at a wavelength of 400 to 700 nm when the glass has a thickness of 0.5 mm.

12 Claims, No Drawings

US 7,170,154 B2

GLASS FOR WINDOW OF SEMICONDUCTOR PACKAGE, GLASS WINDOW FOR SEMICONDUCTOR PACKAGE, PROCESS FOR PRODUCTION OF GLASS WINDOW, AND SEMICONDUCTOR PACKAGE

This application claims priority to JP Application No. 2003-105037 filed 09 Apr. 2003. The entire contents of this application is incorporated herein by reference.

BACKGROUND OF THE INVENTION

1. Field of the Invention

The present invention relates to a glass for a window of a semiconductor package, a glass window for a semiconductor package, a process for the production of the glass window and a semiconductor package. More specifically, the present invention, relates to a glass for use as a window of a semiconductor package made of a plastic for encasing a solid image sensing device of a digital camera or a VTR camera, glass window for the above semiconductor package such as a glass window for a semiconductor package having the function of a near infrared absorption filter for correcting the color sensitivity of sensing device of CCD, a process for the production of the glass window, and a semiconductor package having the above glass window, a semiconductor device and a package for encasing the semiconductor device.

2. Prior Art

A semiconductor device such as CCD causes a soft error due to a ray emitted from a window glass for a package, so that it is required to decrease the amount of radioactive isotope contained in the window glass which radioactive isotope emits a ray. As a glass for semiconductor package window material whose α-ray emission is controlled, for example, JP-A-8-306894 discloses a window glass for a semiconductor package which window glass has its U and Th contents controlled to be 5 ppb or less.

With the downsizing of digital cameras and spreading of cellular phones with a camera in recent years, a high-pixel and small-sized image sensing system is being demanded. The size and thickness of all of components such as a lens, a filter, a package, etc., are decreasing. Further, besides a decrease in the size and thickness, it is proposed to form of a composite unit of components. For example, the above JP-A-8-306894 discloses not only a transparent window glass for a semiconductor package but also a window glass for a semiconductor package which window glass contains CuO and absorbs near infrared wavelength.

A conventional glass for the window of a semiconductor package has a relatively small thermal expansion coefficient, since it is adjusted to have a thermal expansion property corresponding to the thermal expansion property of a package made of ceramic such as an alumina, or the like. When bonded to a package made of a plastic, therefore, the above glass causes the package to be distorted or deformed or is broken due to a thermal expansion difference, so that such a glass is a bar against the use of a plastic material for decreasing the weight of a package.

SUMMARY OF THE INVENTION

Under the circumstances, it is an object of the present invention to provide a glass for a window that can be suitably fitted to a semiconductor package made of a plastic, a glass window for the above semiconductor package which glass window has various functions, a process for the production of the above glass window and a semiconductor package having the above glass window.

The present inventor has made diligent studies and as a result has found the following. A glass having a specific average linear expansion coefficient and a glass having a specific average linear expansion coefficient and having U and Th contents of a certain value or less each are suitable for the above object as a glass for the window of a semiconductor package made of a plastic, and a glass window made of such a glass for a semiconductor package or a glass window for a semiconductor package, having a lens function or a specific spectral transmittance, is suitable for the above object. On the basis of the above finding, the present invention has been completed.

That is, the subject matters of the present invention are;

(1) a glass for a window of a semiconductor package, which is for use as a window material for a semiconductor package made of a plastic and has an average linear expansion coefficient of $120 \times 10^{-7}/°$C. to $180 \times 10^{-7}/°$C. at a temperature of 100 to 300° C. (to be referred to as "glass 1", hereinafter), (2) a glass for a window of a semiconductor package, having an average linear expansion coefficient of $120 \times 10^{-7}/°$C. to $180 \times 10^{-7}/°$C. at a temperature of 100 to 300° C. and having a U content of 5 ppb or less and a Th content of 5 ppb or less (to be referred to as "glass 2" hereinafter), (3) a glass for a window for a semiconductor package as recited in the above (1) or (2), which contains Cu and phosphorus oxide, (4) a glass for a window of a semiconductor package as recited in the above (3), in which a wavelength which exhibits a transmittance of 50% is 630 nm or less in terms of a spectral transmittance at a wavelength of 400 to 700 nm when the glass has a thickness of 0.5 mm, (5) a glass for a window of a semiconductor package as recited in the above (3), which contains, by cation %, 23 to 41% of $P^{5+}$, 4 to 16% of $Al^{3+}$, 11 to 40% of $Li^+$, 3 to 13% of $Na^+$, 12 to 53% of $R^{2+}$ ($R^{2+}$ stands for $Mg^{2+}$, $Ca^{2+}$, $Sr^{2+}$, $Ba^{2+}$ or $Zn^{2+}$) and 2.6 to 4.7% of $Cu^{2+}$ and contains $F^-$ and $O^{2-}$ as anionic components, (6) a glass window for a semiconductor package, which is made of the glass for a window recited in the above (1) or (2) (to be referred to as "glass window 1" hereinafter), (7) a glass window for a semiconductor package, having a lens function and having an average linear expansion coefficient of $120 \times 10^{-7}/°$C. to $180 \times 10^{-7}/°$C. at a temperature of 100 to 300° C. (to be referred to as "glass window 2" hereinafter), (8) a glass window for a semiconductor package, which is formed of a glass having an average linear expansion coefficient of $120 \times 10^{-7}/°$C. to $180 \times 10^{-7}/°$C. at a temperature of 100 to 300° C., having a U content of 5 ppb or less and a Th content of 5 ppb or less and containing Cu and phosphorus oxide, and in which a wavelength which exhibits a transmittance of 50% is 630 nm or less in terms of a spectral transmittance at a wavelength of 400 to 700 nm when the glass window has a thickness of 0.5 mm (to be referred to as "window glass 3" hereinafter), (9) a glass window for a semiconductor package as recited in the above (6), which is a precision press-molded product,

(10) a process for the production of a glass window for a semiconductor package, which comprises precision-press-molding a lens-shaped window material glass made of a glass having an average linear expansion coefficient of $120 \times 10^{-7}/°$C. to $180 \times 10^{-7}/°$C. at a temperature of 100 to 300° C.

(11) a semiconductor package comprising the glass window for a semiconductor package recited in the above (6), a semiconductor device and a package encasing the semiconductor device, the glass window having an attaching portion made of a plastic material, and

(12) a semiconductor package as recited in the above (11), wherein the semiconductor device is an image sensing device.

PREFERRED EMBODIMENTS OF THE INVENTION

In the present invention, the glass for a window refers to a glass for use as a material for a window that is fitted to a semiconductor package, and the glass window refers to a window made of a glass which window is fitted to a semiconductor package. The glass for a window is largely classified into a glass 1 and a glass 2 as follows.

[Glass 1]

The glass 1 is for use as a window material for a semiconductor package made of a plastic, and the average linear expansion coefficient thereof at a temperature of 100 to 300° C. is $120 \times 10^{-7}$/° C. to $180 \times 10^{-7}$/° C., preferably $135 \times 10^{-7}$/° C. to $180 \times 10^{-7}$/° C., more preferably $140 \times 10^{-7}$/° C. to $180 \times 10^{-7}$/° C.

According to the glass 1, when the average linear expansion coefficient thereof is adjusted to the above range, the distortion/deformation of a package made of a plastic and breaking of the glass can be prevented even when the glass 1 is bonded to the package. Further, the glass 1 can provide a window excellent over a window made of a plastic in durability and homogeneity.

The above package includes an entire package for encasing a semiconductor device, a frame body for fixing a window with regard to a semiconductor device and the above frame body that works to hermetically close the light-receiving surface of a semiconductor device with a window. It should be understood that the term "package" hereinafter stands for any one of the above packages.

[Glass 2]

The glass 2 is a glass for a window, which has an average linear expansion coefficient, measured at 100 to 300° C., of $120 \times 10^{-7}$/° C. to $180 \times 10^{-7}$/° C. preferably $135 \times 10^{-7}$/° C. to $180 \times 10^{-7}$/° C. more preferably $140 \times 10^{-7}$/° C. to $180 \times 10^{-7}$/° C. and which has a U content of 5 ppb or less and a Th content of 5 ppb or less.

According to the glass 2, when the average linear expansion coefficient thereof is adjusted to the above range, the distortion/deformation of a package made of a plastic and breaking of the glass can be prevented even when the glass 2 is bonded to the package. Further, since the content of each of U and Th is 5 ppb or less, there can be provided a semiconductor package that is free of a soft error caused by the emission of α ray from a glass window. Therefore, a glass window can be arranged near a semiconductor device, and the size and weight of the package can be decreased.

The glass for a semiconductor package, provided by the present invention, is preferably a glass that has the features of both the above glass 1 and the above glass 2.

For imparting the glass for a window with an average linear expansion coefficient of $120 \times 10^{-7}$/° C. to $180 \times 10^{-7}$/° C at a temperature of 100 to 300° C., it is preferred to incorporate an alkali metal oxide, fluorine or both of an alkali metal oxide and fluorine. The content of the alkali metal oxide and fluorine can be determined by taking account of the above expansion coefficient and climate resistance.

The above climate resistance can be evaluated by maintaining a surface-polished glass sample at a temperature of 60° C. at a humidity of 80% RH for 1,000 hours and then observing the polished surface of the sample for alterations such as burning and the like. That is, when a glass has excellent climate resistance, no surface alternation is found after the above climate resistance test, and such a glass can be fully used as a glass for a window. A glass other than the above glass shows alterations on the surface thereof, and such a glass is not usable as a glass for a window. It can be also determined on the basis of a difference between a spectral transmittance found before the above climate resistance test and a spectral transmittance found after the above climate resistance whether a glass has good climate resistance or poor climate resistance. A maximum value of spectral transmittance at a wavelength of 400 to 700 nm, found before the test, and such a data found after the test are compared, and if the maximum value of spectral transmittance found after the test is 90% or more of the data found before the test, such a glass can be said to have excellent climate resistance. For the measurement of spectral transmittance, there is used a sample having both surfaces polished so as to be parallel with each other. The spectral transmittance includes an optical loss in a sample surface, so that a sample surface state before the test and a sample surface state after the test can be compared.

The glass for a window preferably has a glass transition temperature of 550° C. or lower. When the glass has such a low glass transition temperature, the glass can be precision press-molded to produce a glass window. By precision press-molding, the surface of the glass window through which surface light enters or goes out can be formed into a lens shape, or a pattern for providing a function as a diffraction grating or a pattern for providing a function as an optical low pass filter can be productively formed on the above surface through which light enters or goes out.

From the viewpoint of a glass composition, a phosphorus oxide-containing glass (such as a fluorophosphate glass or phosphate glass) and a glass containing $SiO_2$ and an alkali metal oxide are suitable as the above glass for a window. These glasses can easily give a homogeneous glass. As a glass for a window, a fluorophosphate glass is particularly preferred.

The phosphate glass (a fluorophosphate glass or phosphate glass) is a glass containing phosphorus oxide as a main component and will be specially explained later.

As a glass containing $SiO_2$ and an alkali metal oxide, a glass containing $SiO_2$, $TiO_2$ and an alkali metal oxide is preferred. Specifically, the above glass preferably has a glass composition containing $SiO_2$, $TiO_2$ and an alkali metal oxide as essential components and having a total essential component content of 60 mol % or more, and more preferably has a glass composition containing, by mol %, 38 to 58% of $SiO_2$, 7 to 30% of $TiO_2$ and 15 to 40% of alkali metal oxides as a total and 0 to 12% of $Al_2O_3$. Of these glasses, a glass containing 10 to 25% of $Na_2O$, 4 to 15% of $K_2O$, 0 to 13% of MgO, 0 to 10% of CaO, 0 to 8% of SrO, 0 to 6% of BaO, 0 to 10% of ZnO and 0 to 1% of $Sb_2O_3$ is still more preferred, and a glass having an MgO content of 1 to 13% and a ZnO content of 0.5 to 10% is particularly preferred. A glass having the above glass composition can have optical constants such as a refractive index (nd) of about 1.6 and an Abbe's number (vd) of approximately 36–37.

While both an alkali metal oxide and fluorine work to increase the expansion coefficient, they do not easily cause an adversary effect on climate resistance, so that phosphorus oxide-containing glasses (fluorophosphate glass and phosphate glass) are more preferred. These glasses will be specifically explained later.

For providing a glass for a window with the color correction filter function of a semiconductor image sensing device, Cu can be incorporated into the glass to impart the glass with a near infrared absorption property. As a glass for a window having the above color correction filter function, it is preferred to use a glass containing Cu and phosphorus oxide (fluorophosphate glass or phosphate glass). It is more preferred to use a glass that exhibits a transmittance of 50% at a wavelength of 630 nm or less in terms of a spectral transmittance at a wavelength of 400 to 700 nm when the glass has a thickness of 0.5 mm.

Further, since the glass for a window is arrange close to a semiconductor image sensing device, it is important to control the size and the amount of included platinum foreign matter in the glass so that these size and amount are at levels lower than levels of the counterparts of a general optical glass. The reason therefor is that when a glass for a window includes foreign matter such as platinum particles, there is caused an adversary effect that they are reflected in an image-sensing device or that an image is blurred due to the diffraction of the foreign matter. Foreign matter is controlled in generally used optical devices made of glass such as a lens. Since, however, these optical devices are used in a state where they are apart from an image-sensing device, so that these optical devices do not cause the reflection of foreign matter or the diffraction-based degradation of an image quality to such an extent as a window material glass does. In the glass for a window, provided by the present invention, the number of platinum foreign matter having a particle diameter of 2 μm or larger is preferably 10 particles/100 ml, and more preferably, no platinum foreign matter having a particle diameter of 2 μm or larger is contained. For decreasing the contents of included radioactive substances such as U and Th, it is also preferred to prevent the inclusion of the platinum foreign matter.

Besides the platinum foreign matter, when Cu is incorporated, it is preferred to prevent the precipitation of Cu metal particles or Cu compound particles. Further, the glass for a window is preferably formed of an amorphous phase.

A glass composition particularly suitable as a Cu-containing glass will be explained below. The glass composition therefor contains, by cation %, 23 to 41% of $P^{5+}$, 4 to 16% of $Al^{3+}$, 11 to 40% of $Li^+$, 3 to 13% of $Na^+$, 12 to 53% of $R^{2+}$ ($R^{2+}$ stands for $Mg^{2+}$, $Ca^{2+}$, $Sr^{2+}$, $Ba^{2+}$ or $Zn^{2+}$) and 2.6 to 4.7% of $Cu^{2+}$ and contains $F^-$ and $O^{2-}$ as anion components. Contents (%) of the cations will stand for cation %, and contents (%) of the anions will stand for anion % hereinafter.

$P^{5+}$ is a basic component for the fluorophosphate glass and is an essential component for generating the absorption of infrared. When the content thereof is less than 23%, the glass is sometimes colored in a greenish color. When it exceeds 41%, the glass tends to be degraded in climate resistance and devitrification resistance. The content of $P^{5+}$ is therefore preferably 23 to 41%.

$Al^{3+}$ is an important component for improving the fluorophosphate glass in devitrification resistance. When the content thereof is less than 4%, the glass is poor in devitrification resistance, and the glass is liable to have a high liquidus temperature, so that it may be difficult to mold a high-quality glass by melting. When it exceeds 16%, the glass is sometimes poor in devitrification resistance. The content of $Al^{3+}$ is therefore preferably 4 to 16%.

$Li^+$ is a component effective for improving the glass in devitrification resistance. When the content thereof is less than 11%, the above effect is insufficient. When it exceeds 40%, the glass is sometimes degraded in durability and processability (moldability). The content of $Li^+$ is therefore preferably 11 to 40%.

$Na^+$ is also a component effective for improving the glass in devitrification resistance. When the content thereof is less than 3%, the above effect is insufficient. When it exceeds 13%, the glass is sometimes degraded in durability and processability (moldability). The content of $Na^+$ is therefore preferably 3 to 13%.

$R^{2+}$ ($Mg^{2+}$, $Ca^{2+}$, $Sr^{2+}$, $Ba^{2+}$ or $Zn^{2+}$) is a component effective for improving the fluorophosphate glass in devitrification resistance, durability and processability (moldability). When the total content of $R^{2+}$ is less than 12%, the glass is liable to be degraded in devitrification resistance and durability. When it exceeds 53%, the glass is sometimes degraded in devitrification resistance. The content of $R^{2+}$ is therefore preferably 12 to 53%.

The content of $Mg^{2+}$ is preferably in the range of 3 to 5%, the content of $Ca^{2+}$ is preferably in the range of 6 to 9%, the content of $Sr^{2+}$ is preferably in the range of 5 to 8%, the content of $Ba^{2+}$ is preferably in the range of 3 to 6%, and the content of $Zn^{2+}$ is preferably in the range of 0 to 3%.

When the content of $Cu^{2+}$ is less than 2.6%, the absorption of infrared is small, and when the glass has a thickness of 0.5 mm, the wavelength at which the glass exhibits a transmittance of 50% is longer than 630 nm in the range of 400 to 700 nm. When it exceeds 4.7%, the glass is caused to be poor in devitrification resistance. The content of $Cu^{2+}$ is therefore preferably 2.6 to 4.7%.

$O^{2-}$ is a particularly important anion component for the above window material glass. When the content thereof is less than 52%, a divalent $Cu^{2+}$ is reduced to a monovalent $Cu^+$, so that the absorption in a short wavelength region, particularly at and around 400 nm, tends to become great, which results in a greenish color. The content of $O^{2-}$ is therefore preferably 52 to 75%.

$F^-$ is an important anion component for decreasing the melting point of the glass and improving the glass in climate resistance. When the above window material glass contains $F^-$, the melting point of the glass can be decreased, and it is made easily possible to control the amount of U, Th and platinum foreign matter that come into the glass from a furnace wall, a refractory material or a refractory vessel during the melting of the glass. When the content thereof is less than 25%, the climate resistance of the glass is insufficient. When it exceeds 48%, the content of $O^{2-}$ is relatively small, so that the glass is caused to be colored at and around 400 nm due to the monovalent $Cu^+$. The content of $F^-$ is therefore preferably 25 to 48%.

$K^+$, $Zr^{4+}$, $La^{3+}$, $Gd^{3+}$, $Y^{3+}$, $Si^{4+}$, $B^{3+}$, $Sb^{3+}$ and $Ce^{4+}$ may be used as required for improving the glass in devitrification resistance, adjusting the viscosity of the glass and performing clarification. The total content of the above cations is preferably less than 5%, more preferably less than 1%, and still more preferably, none of these cations are incorporated.

Preferred glass compositions are as follows.

(Preferred Glass Composition 1)

A fluorophosphate glass containing 23 to 41% of $P^{5+}$, 4 to 16% of $Al^{3+}$, 11 to 40% of $Li^+$, 3 to 13% of $Na^+$, 12 to 53% of $R^{2+}$ ($R^{2+}$ stands for $Mg^{2+}$, $Ca^{2+}$, $Sr^{2+}$, $Ba^{2+}$ or $Zn^{2+}$) and 2.6 to 4.7% of $Cu^{2+}$ as cationic components and containing 25 to 48% of $F^-$ and 52 to 75% of $O^{2-}$ as anionic components.

(Preferred Glass Composition 2)

A fluorophosphate glass in which the total content of $P^{5+}$, $Al^{3+}$, $Li^+$, $Na^+$, $Mg^{2+}$, $Ca^{2+}$, $Sr^{2+}$, $Ba^{2+}$, $Zn^{2+}$, $Cu^{2+}$ and $Sb^{3+}$ is at least 99 cationic %, more preferably 100 cationic %.

(Preferred Glass Composition 3)

A fluorophosphate glass in which the total content of $F^-$ and $O^{2-}$ is 100 anionic %.

(Preferred Glass Composition 4)

A fluorophosphate glass containing none of Pb, As and Cd. Not only the fluorophosphate glass containing none of Pb, As and Cd, but also any one of window material glasses 1 to 3 containing none of Pb, As and Cd is preferred.

The above fluorophosphate glass can attain optical constants such as a refractive index (nd) of about 1.5 and an Abbe's number (vd) of about 74.5. For designing a lens form, the above optical constants can be referred to.

Phosphorus oxide-containing glasses such as phosphate glass and fluorophosphate glass generally have poor chemical durability and cannot withstand a climate resistance test that is carried out, for example, under an environment having a temperature of 60° C. and a humidity of 80% RH for 1,000 hours, and the glass surface is corroded to be opacified or roughened. The above glass has excellent chemical durability and can withstand a climate resistance in which a glass is held under an environment at 60° C. and 80 % RH for 1,000 hours, and it can retain a surface state sufficient for use as a window material glass.

The process for the production of a glass for a window will be explained below.

As glass raw materials for a glass for a window, it is desirable to use raw materials whose U and Th contents are 1 ppb or less. For example, raw materials such as phosphates, fluorides, carbonates, nitrates, oxides, etc., are weighed so that a desired composition can be obtained, and they are mixed and melted in a refractory crucible, for example, at 800 to 900° C. The material for the refractory crucible is preferably quartz or platinum whose U and Th contents are remarkably small, and particularly preferably, the raw materials are preliminarily melted in a quartz crucible and are finally melted in a platinum crucible. In this manner, the occurrence of platinum foreign matter is suppressed. When the fluorine-containing glass is melted, it is desirable to use a refractory cover made of quartz or platinum for preventing the volatilization of a fluorine component. Further, the atmosphere for the melting can be atmosphere without any problem. When a Cu-containing glass for a window is melted, it is preferred to employ an oxygen atmosphere or bubble oxygen in the molten glass for preventing a change in the valence of Cu. For preventing the inclusion of U, Th and platinum foreign matter that are from a furnace wall, a refractory material and a melting crucible, a lower melting temperature is preferred. A glass in a molten state is stirred and clarified, and then the glass is allowed to flow out to shape a glass for a window.

The method of shaping the glass for a window includes conventional methods such as casting, flowing from a pipe, rolling, pressing, while shaping of a glass having a large area and a large thickness is particularly preferred. The thus-shaped glass material is transferred into an annealing furnace heated at a temperature around the glass transition temperature of the glass in advance, and gradually cooled to room temperature.

The thus-obtained glass material is sliced, cut and polished to give a glass window.

The glass window for a semiconductor package will be explained below. The glass window of the present invention is largely classified into glass windows 1 to 3.

[Glass Window 1]

The glass window 1 is formed from any one of the above glasses for a window. When the glass window is constituted of any one of the above glasses for a window, properties of the glasses are utilized, and there can be therefore provided a glass window that can be excellently fitted to a package, which can prevent influences caused by radioactive rays and which can be imparted with the function of near infrared absorption.

[Glass Window 2]

The glass window 2 has a lens function, and at a temperature of 100 to 300° C., the average linear expansion coefficient thereof is $120\times10^{-7}$/° C. to $180\times10^{-7}$/° C. preferably $135\times10^{-7}$/° C. to $180\times10^{-7}$/° C. more preferably $140\times10^{-7}$/° C. to $180\times10^{-7}$/° C.

According to the glass window 2, the distortion/deformation of a package made of a plastic and breaking of the glass can be prevented when the glass window 2 is bonded to the package. Further, having a lens function, the glass window 2 can constitute part or the whole of an image-forming optical system for forming light transmitted through a glass window into an image on the light-receiving surface of a semiconductor image-sensing device housed in a package. Therefore, the number of parts can be decreased, and there can be also prevented a decrease in the amount of light to be detected on the light-receiving surface of a semiconductor image-sensing device.

The glass window can be imparted with the above lens function by forming the glass window in the form, for example, of a converging meniscus lens, a diverging meniscus lens, a flat converging lens or a flat diverging lens, by forming a diffraction pattern on the surface of the window material glass, or by forming a refractive index distribution.

[Glass Window 3]

The glass window 3 is a flat-plate-shaped glass window for a semiconductor package, which is formed of a Cu- and phosphorus oxide-containing glass having an average linear expansion coefficient, measured at 100 to 300° C., of $120\times10^{-7}$/° C. to $180\times10^{-7}$/° C., preferably $135\times10^{-7}$/° C. to $180\times10^{-7}$/° C. more preferably $140\times10^{-7}$/° C. to $180\times10^{-7}$/° C. having a U content of 5 ppb or less and a Th content of 5 ppb or less, and in which a wavelength which exhibits a transmittance of 50% is 630 nm or less in terms of a spectral transmittance at a wavelength of 400 to 700 nm when the glass window has a thickness of 0.5 mm. The Cu— and phosphorus oxide-containing glass includes a Cu-containing fluorophosphate glass and a Cu-containing phosphate glass, and a Cu-containing fluorophosphate glass is more preferred.

Containing Cu, the glass window 3 is imparted with the property of near infrared absorption and the above spectral transmittance property and exhibits the function of color correction filter of a semiconductor image-sensing device. Further, another feature of the glass window 3 is that it has the form of a flat plate. Having the above spectral transmittance property, the glass window 3 fully works as a color correction filter of a semiconductor image-sensing device even when it is formed as a thin plate. Further, having the above thermal expansion property, the glass window 3 is free from package-distortion/deformation and glass-breaking even when a thin plate thereof is bonded to a plastic package, so that the glass window 3 is suitable for decreasing the thickness, size and weight of a glass window.

The glass window 3, and flat plates of the glass window 1 and the glass window 2 preferably have a thickness of 0.1 to 0.8 mm, more preferably, 0.3 to 0.6 mm.

As a glass window for a semiconductor package in the present invention, preferably are a glass window having the properties of both the glass windows 1 and 2, a glass window having the properties of both the glass windows 1 and 3, a glass window having the properties of both the glass windows 2 and 3 and a glass window having the properties of all of the glass windows 1 to 3.

Particulars common to the glass windows 1 to 3 will be explained below.

The above glass window is preferably a precision-press-molded product. The precision-press-molded product refers to a glass molded product produced by precision-press-molding a glass in a plastic-deformable state, and the precision-press-molding refers to a molding method in which the molding surface of a press mold is precisely transferred to the above glass to form an optical-function surface. The optical-function surface refers to a surface that is used for reflecting, refracting, diffracting or transmitting light to be controlled, and corresponds to a surface of a glass window through light enters and goes out. The precision-press-molding can give sufficient functions without machining such as cutting and polishing of an optical surface. Examples of the precision-press-molded product include glass windows that also work as an aspherical lens such as a converging meniscus lens, a diverging meniscus lens, a flat converging lens and a flat diverging lens, glass windows that also work as a spherical lens such as a converging meniscus lens, a diverging meniscus lens, a flat converging lens and a flat diverging lens, a glass window that also work as a Fresnel lens, and a glass window having a surface on which a pattern having a low pass filter function is formed. Further, it may be a glass window in the form of a flat plate.

Each glass window is suitable as a glass window for a plastic package. Although not specially limited, the material for the plastic package includes a glass-filler-containing epoxy resin as a material that permits excellent packaging. Particulars of the package material will be discussed later.

The glass composition suitable for the glass windows 1 to 3 is common to the glass composition suitable for the above glass for a window. The above glass window is similar to the above glass for a window in that Cu is incorporated for imparting the property of near infrared absorption and that a phosphate glass or a fluorophosphate glass is preferred when Cu is incorporated.

In the glass window 3, the content of each of U and Th is 5 ppb or less, preferably 3 ppb or less, as already described. In the glass windows 1 and 2, similarly, the content of each of U and Th is 5 ppb or less, preferably 3 ppb or less. When such a glass window is used, there can be provided a semiconductor package that is free of a soft error caused by α ray emitted from a glass window. Therefore, the glass window can be arranged close to a semiconductor device, so that the package can be decreased in size and weight. The content of each of U and Th is adjusted to a remarkably low level as described above, so that the occurrence of a soft error can be prevented even when a semiconductor image-sensing device of large pixel number is used. The above package is suitable for a semiconductor package for housing an image-sensing device of 1,000,000 pixels or more, more suitable for a semiconductor package for housing an image-sensing device of 1,500,000 pixels or more, and still more suitable for a semiconductor package for housing an image-sensing device of 2,000,000 pixels or more.

The process for the production of a glass window for a semiconductor package, provided by the present invention, will be explained below. The above process comprises precision-press-molding a lens-shaped window material glass formed of a glass having an average linear expansion coefficient, measured at 100 to 300° C., of $120 \times 10^{-7}/°C$ to $180 \times 10^{-7}/°C$. preferably $135 \times 10^{-7}/°C$. to $180 \times 10^{-7}/°C$., more preferably $140 \times 10^{-7}/°C$. to $180 \times 10^{-7}/°C$.

In the above process, first, a preform having a weight equivalent to the weight of a press-molded product is formed. The preform can be formed by a method in which a glass block obtained by shaping a molten glass is machined to have a predetermined weight or a method in which a molten glass having a predetermined weight is shaped into a preform while the glass is softened state. A thin film may be formed on the preform surface as required for attaining precision press-moldability. Then, the preform is re-heated and precision-press-molded with a press mold. The molding surface of the press mold is processed so as to have an inversion form of a lens surface form, and the form of the molding surface is precisely transferred to the glass by the press molding, to give a precision-press-molded product having the form of a lens. Desirably, the precision-press-molding is carried out in a non-oxidizing atmosphere of nitrogen or a gas mixture of nitrogen with hydrogen. The press mold can be selected from a mold made of an ultra-hard alloy or SiC or a mold having a molding surface on which a release film such as a carbon film or a noble metal alloy film is formed. The preform can be re-heated and pressed, and thus-obtained precision-press-molded product can be cooled, by known methods, and conditions of each step can be determined as required depending upon the form and the size of the precision-press-molded product.

In the above manner, the above glass window can be formed. The precision-press-molded product may be processed to center the product as required, or an anti-reflection film may be formed on the optical-function surface thereof. Further, together with a lens form, a pattern for exhibiting the function of an optical low pass filter may be formed on the surface of a glass window by the precision-press-molding.

The semiconductor package of the present invention will be explained below. The semiconductor package of the present invention comprises the above glass window or a glass window produced by a method using the above precision-press-molding, a semiconductor device for receiving light that enters through the glass window above and a package made of a plastic for encasing the semiconductor device. The semiconductor device is preferably a solid image-sensing device such as CCD or CMOS. The above package may be a package entirely formed of a plastic, while it has at least glass window fitting portion made of a plastic material.

The above package includes an entire package for encasing a semiconductor device, a member for covering a light-receiving portion of the semiconductor device together with a glass window or a frame material for fixing the glass window to the semiconductor device, or the above frame material having the function of hermetically closing the light-receiving portion of the semiconductor device together with the glass window.

The material for the package made of a plastic is not specially limited and can be selected from various materials. Specifically, the above material can be selected from thermosetting resins such as an epoxy resin (a bisphenol A type epoxy resin, a novolak type epoxy resin, a glycidylamine type epoxy resin, etc.), a polyimide resin, a phenolic resin, an unsaturated polyester resin and a silicone resin, and thermoplastic resins such as a liquid crystal polymer, a polyphenylene sulfide resin and a polysulfone resin. These resins may contain a curing agent, a curing promoter, a moisture absorption agent, a filler, a flame retardant, a pigment and a mold release agent and further may contain an inorganic filler. Of these, an epoxy resin containing a glass filler is particularly preferred as a material for excellent packaging. The method of fitting (attaching) the glass window to the package is not specially limited, and, for example, bonding with an ultraviolet-curing resin may be employed.

According to the above semiconductor package, the glass window matches with the package or a glass-window-fitting portion of the package with regard to thermal expansion properties, so that the distortion/deformation of the package and breaking of the glass can be prevented when the package and the glass window are bonded to each other.

Further, when the glass window is formed in the form of a thin plate, the distortion and breaking of the glass can be prevented. Further, the glass window having the function of a lens can perform excellent formation of an image since the glass window is free of distortion.

Further, when the Cu-containing glass is used as a glass window, the glass window works as a color correction filter, so that the number of parts can be decreased. Similarly, by providing the glass window with the function of a lens, or by providing the glass window with the function of a lens and the function of a color correction filter, the number of parts can be decreased, and a device can be decreased in size and weight.

In the package material, like the window material glass, it is desirable to fully take care to prevent the inclusion of radioactive substances.

The package may be provided with an optical system for forming an image of an object on the light-receiving portion of a semiconductor image-sensing device in addition to the above glass window. The above optical system is composed of one or a plurality of lenses, and depending upon whether or not the glass window has the function of a lens, the form of each lens from materials having desired optical properties and the arrangement of each lens can be determined according to a known optical design method. Further, the above optical system may be additionally provided with an aperture as required. Further, for lenses for constituting the above optical system, preferably, glass materials like the window material are used. Further, it is preferred to use a glass having an average linear expansion coefficient, measured at 100 to 300° C., of $120\times10^{-7}/°$ C. to $180\times10^{-7}/°$ C. preferably $135\times10^{-7}/°$ C. to $180\times10^{-7}/°$ C., more preferably $140\times10^{-7}/°$ C. to $180\times10^{-7}/°$ C. Further, the above glass is preferably selected from glasses that come under a phosphorus oxide containing glass (a phosphate glass or a fluorophosphate glass) or a glass containing $SiO_2$ and an alkali metal oxide and which have a glass transition temperature of 600° C. or lower.

EXAMPLES

The present invention will be explained with reference to Examples hereinafter, while the present invention shall not be limited by these Examples.

Examples 1–6

Raw materials such as phosphates, fluorides, carbonates, nitrates, oxides, and the like were taken and weighed so as to obtain compositions shown in Tables 1 and 2, and the raw materials for each glass were mixed and then melted in a platinum crucible. Glasses in Examples 1 to 5 were melted at 800 to 900° C., and the glass in Example 6 was melted at 1,300° C. The glass in Example 6 contained no Cu.

Each glass was stirred and clarified, and then the glass was cast on an iron plate to form glass blocks having compositions shown in Tables 1 and 2. Each glass block was transferred into a furnace that had been heated to a temperature around the glass transition temperature of each, and annealed to room temperature. Samples for various measurements were taken from the thus-obtained glass blocks and measured for the following properties by the following methods. Tables 1 and 2 show the results.

(1) Average Linear Expansion Coefficient

A sample was measured for an average linear expansion coefficient at 100 to 300° C. according to Japan Optical Glass Industry Standard JOGIS-08.

(2) Spectral Transmittance

A sheet glass sample having a thickness of 0.5 mm was prepared by polishing both surfaces thereof so that the surfaces were in parallel with each other, and it was measured for a spectral transmittance with a spectrophotometer. Each parameter was calculated. Each glass was homogeneous, so that a transmittance of each sample having any thickness can be calculated according to a known method on the basis of the transmittance data obtained by the measurement of the 0.5 mm thick samples. The spectral transmittance includes a reflection loss on each sample surface.

(3) The Content of Each of U and Th was Measured with an ICP Mass Analyzer.

(4) Climate Resistance

As a climate resistance test, a polished sample was maintained under conditions of a temperature 60° C. and a humidity 80% RH for 1,000 hours, and then the sample surface was observed to evaluate its climate resistance.

(5) Number Density of Platinum Foreign Matter

A sample was enlarged through an optical microscope and observed to count included particles having a diameter of 2 μm or more, and a numerical density was determined on the basis of the number of counted foreign matter and the volume of an observed region.

TABLE 1

| | | Unit | Ex. 1 | Ex. 2 | Ex. 3 | Ex. 4 | Ex. 5 |
|---|---|---|---|---|---|---|---|
| Glass composition | $P^{5+}$ | Cationic % | 24.3 | 28.3 | 28.2 | 38.3 | 32.5 |
| | $Al^{3+}$ | " | 8.1 | 11.4 | 11.3 | 8.0 | 5.0 |
| | $B^{3+}$ | " | 0.0 | 0.0 | 0.0 | 0.0 | 0.0 |
| | $Li^+$ | " | 21.7 | 23.5 | 23.4 | 23.6 | 28.5 |
| | $Na^+$ | " | 7.7 | 7.5 | 4.8 | 2.4 | 5.0 |
| | $Mg^{2+}$ | " | 5.7 | 4.0 | 4.0 | 0.0 | 0.0 |
| | $Ca^{2+}$ | " | 12.0 | 8.4 | 8.4 | 0.0 | 3.6 |
| | $Sr^{2+}$ | " | 8.7 | 6.2 | 6.1 | 7.5 | 1.4 |
| | $Ba^{2+}$ | " | 7.5 | 5.3 | 5.2 | 17.2 | 10.0 |
| | $Zn^{2+}$ | " | 0.0 | 2.1 | 5.4 | 0.0 | 10.0 |
| | $Cu^{2+}$ | " | 4.3 | 3.3 | 3.2 | 3.0 | 4.0 |
| | Total of cations | " | 100 | 100 | 100 | 100 | 100 |
| | $F^-$ | Anionic % | 39.9 | 39.9 | 40.9 | 35.5 | 45.0 |
| | $O^{2-}$ | " | 60.1 | 60.1 | 59.1 | 64.5 | 55.0 |
| | Total of anions | " | 100 | 100 | 100 | 100 | 100 |

TABLE 1-continued

|  |  | Unit | Ex. 1 | Ex. 2 | Ex. 3 | Ex. 4 | Ex. 5 |
|---|---|---|---|---|---|---|---|
| Properties | λ50 | nm | 591 | 609 | 615 | 618 | 595 |
|  | T400 | % | 80.2 | 84.2 | 82.5 | 84 | 80 |
|  | T600 | % | 42.2 | 55.5 | 58.3 | 60 | 43 |
|  | T1200 | % | 5.8 | 6.1 | 13.2 | 15 | 6 |
|  | α | ×10$^{-7}$/° C. | 160 | 152 | 150 | 145 | 170 |
|  | U content | ppb | 2 | 1 | 1 | 2 | 2 |
|  | Th content | ppb | <1 | <1 | <1 | <1 | <1 |

Ex. = Example
Note 1:
λ50 stands for a wavelength at which a sample having a thickness of 0.5 mm exhibits a spectral transmittance of 50%.
Note 2:
T400, T600 and T1200 show transmittances of a sample having a thickness of 0.5 mm at wavelengths of 400 nm, 600 nm and 1,200 nm, respectively.
Note 3:
α stands for an average linear expansion coefficient at 100 to 300° C.

TABLE 2

|  |  | Unit | Example 6 |
|---|---|---|---|
| Glass composition | SiO$_2$ | Mol % | 45 |
|  | Al$_2$O$_3$ | " | 3 |
|  | Na$_2$O | " | 21 |
|  | K$_2$O | " | 7 |
|  | TiO$_2$ | " | 17 |
|  | MgO | " | 5 |
|  | ZnO | " | 2 |
|  | Sb$_2$O$_3$ | " | 0.1 (based on total) |
|  | Total | " | 100 |
| Properties | GTT | ° C. | 500 |
|  | α | ×10$^{-7}$/° C. | 140 |
|  | U content | ppb | 1 |
|  | Th content | ppb | <1 |

GTT = Glass transition temperature
Note 1:
α stands for an average linear expansion coefficient at 100 to 300° C.

The glasses in all of Examples have an average linear expansion coefficient in the range of 140×10$^{-7}$/° C. to 180×10$^{-7}$/° C. at 100 to 300° C., and the content of each of U and Th in any glass is less than 5 ppb. Further, no foreign matter having a particle diameter of 2 μm or more, including platinum foreign matter, was found. Further, there were found none of Cu metal particles, Cu compound particles and crystal phases.

As a result of the climate resistance test, no glasses in Examples showed surface alterations such as burning. Concerning the maximum value of the glasses after the test, further, each glass after the test maintained more than 90% of the maximum value of the spectral transmittance found before the test.

With regard to the glasses in Examples 1 to 5, the wavelength at which they exhibited a transmittance of 50% was less than 630 nm in the spectral transmittance at a wavelength of 400 to 700 nm when they had a thickness of 0.5 mm.

Example 7

The glass obtained in Example 1 was bonded to a plastic package encasing a CCD having an effective pixel number of 2,000,000 with an ultraviolet-curable resin, to obtain a semiconductor package. Concerning a material for the package, the package was made of an epoxy resin containing a glass filler, and it had a thermal expansion coefficient of 150×10$^{-7}$/° C. The semiconductor package with the window material glass bonded thereto was subjected to a heat cycle test of −40° C. to +120° C. After 100 cycles, the glass was observed for its state to show no damage in any of the window material glass, the package and the bonding portion of these. An optical system was arranged in such a manner that an image was formed on the light-receiving surface of the CCD in the semiconductor package, and an image picked up with the CCD was observed. As a result, the occurrence of no soft error was found, and it was found that colors were faithfully reproduced by excellent color correction and that an excellent image was obtained. When. the glasses obtained in Examples 2 to 5 were tested in the same manner as above, excellent results were similarly obtained. Further, since the window material glass obtained in Example 6 contained no Cu, it had no function of a color correction filter, while it was excellent as a glass window for a semiconductor package.

Further, with regard to each of the glasses obtained in Examples 1 to 6, the above procedures were repeated in the same manner as described above except that the above plastic package encasing a CCD was replaced with a plastic package (made of the same material as the above-explained) encasing a CMOS image-sensing device. As a result, there were obtained excellent results similar to the results in the case of the packages encasing a CCD each.

Specific examples of the above plastic packages include a digital camera encasing a CCD or CMOS image-sensing device and a cellular phone with a camera encasing a CCD or CMOS image-sensing device.

Example 8

Preforms were formed from the glasses in Examples 1 to 6, and the preforms were re-heated and precision-press-molded to obtain aspherical lenses. The aspherical lenses were bonded and fixed, as glass windows, to the same packages as the package encasing CCD used in Example 7, to obtain semiconductor packages. Then, image-forming optical systems including the above glass windows were constituted, and images of an object were formed on the light-receiving surfaces of CCD to observe the formed images. As a result, excellent images were obtained. Further, when the glasses obtained in Examples 1 to 5 were used, excellent color reproduction was accomplished without using any color correction filter having the property of near infrared ray absorption. In the present invention, the glass window is formed of a lens, so that the number of parts can be also decreased.

Further, with regard to the glasses obtained in Examples 1 to 6, when the above procedures are repeated in the same manner as described above except that the above plastic package encasing a CCD is replaced with a plastic package (made of the same material as the above-explained) encasing a CMOS image-sensing device, there can be also obtained excellent results similar to the results in the case of the packages encasing a CCD each.

Like Example 7, specific examples of the above plastic packages include a digital camera encasing a CCD or CMOS image-sensing device and a cellular phone with a camera encasing a CCD or CMOS image-sensing device.

EFFECT OF THE INVENTION

According to the present invention, there can be provided a glass for the window of a semiconductor package which glass can be excellently fitted to a package made of a plastic, a glass window for a semiconductor package, a process for the production of the glass window and a semiconductor package having the above glass window.

The invention claimed is:

1. A glass for a window of a semiconductor package, which is for use as a window material for a semiconductor package made of a plastic and has an average linear expansion coefficient of $120\times10^{-7}/°$ C. to $180\times10^{-7}/°$ C. at a temperature of 100 to 300° C. and contains Cu and phosphorus oxide in which a wavelength which exhibits a transmittance of 50% is 630 nm or less in terms of a spectral transmittance at a wavelength of 400 to 700 nm when the glass has a thickness of 0.5 mm.

2. A glass for a window of a semiconductor package, having an average linear expansion coefficient of $120\times10^{-7}/°$ C. to $180\times10^{-7}/°$ C. at a temperature of 100 to 300° C. and having a U content of 5 ppb or less and a Th content of 5 ppb or less.

3. A glass window for a semiconductor package, having a lens function and having an average linear expansion coefficient of $120\times10^{-7}/°$ C. to $180\times10^{-7}/°$ C. at a temperature of 100 to 300° C. and contains Cu and phosphorus oxide in which a wavelength which exhibits a transmittance of 50% is 630 nm or less in terms of a spectral transmittance at a wavelength of 400 to 700 nm when the glass has a thickness of 0.5 mm.

4. A glass window for a semiconductor package, which is formed of a glass having an average linear expansion coefficient of $120\times10^{-7}/°$ C. to $180\times10^{-7}/°$ C. at a temperature of 100 to 300° C., having a U content of 5 ppb or less and a Th content of 5 ppb or less and containing Cu and phosphorus oxide, in which a wavelength which exhibits a transmittance of 50% is 630 nm or less in terms of a spectral transmittance at a wavelength of 400 to 700 nm when the glass window has a thickness of 0.5 mm.

5. A glass for a window of a semiconductor package, which is for use as a window material for a semiconductor package made of a plastic and has an average linear expansion coefficient of $120\times10^{-7}/°$ C. to $180\times10^{7}/°$ C. at a temperature of 100 to 300° C. and, the glass contains, by cationic %, 23 to 41% of $P^{5+}$, 4 to 16% of $Al^{3+,}$ 11 to 40% of $Li^+$, 3 to 13% of $Na^+$, 12 to 53% of $R^{2+}$ ($R^{2+}$ stands for $Mg^{2+}$, $Ca^{2+}$, $Sr^{2+}$, $Ba^{2+}$ or $Zn^{2+}$) and 2.6 to 4.7% of $Cu^{2+}$ and contains $F^-$ and $O^{2-}$ as anionic components.

6. A process for the production of a glass window for a semiconductor package, which comprises precision-press-molding a lens-shaped window material glass made of a glass having an average linear expansion coefficient of $120\times10^{-7}/°$ C. to $180\times10^{-7}/°$ C. at a temperature of 100 to 300° C. and contains Cu and phosphorus oxide in which a wavelength which exhibits a transmittance of 50% is 630 nm or less in terms of a spectral transmittance at a wavelength of 400 to 700 nm when the glass has a thickness of 0.5 mm.

7. A glass window for a semiconductor package, which is made of the glass recited in claim 1, 2 or 5.

8. A semiconductor package comprising the glass window for a semiconductor package recited in claim 7, a semiconductor device and a package encasing the semiconductor device, the glass window having an attaching portion made of a plastic material.

9. A semiconductor package as recited in claim 8, wherein the semiconductor device is an image-sensing device.

10. A glass window for a semiconductor package, having a lens function and having an average linear expansion coefficient of $120\times10^{-7}/°$ C. to $180\times10^{-7}/°$ C. at a temperature of 100 to 300° C. and contains Cu and phosphorus oxide in which a wavelength which exhibits a transmittance of 50% is 630 nm or less in terms of a spectral transmittance at a wavelength of 400 to 700 nm when the glass has a thickness of 0.5 mm wherein the glass contains, by cationic %, 23 to 41% of $P^{5+}$, 4 to 16% of $Al^{3+}$, 11 to 40 of $Li^{+,}$ 3 to 13% of $Na^+$, 12 to 53% of $R^{2+}$ ($R^{2+}$ stands for $Mg^{2+}$, $Ca^{2+}$, $Sr^{2+}$, $Ba^{2+}$ or $Zn^{2+}$) and 2.6 to 4.7% of $Cu^{2+}$ and contains $F^-$ and $O^{2-}$ as anionic components.

11. A process for the production of a glass window for a semiconductor package, which comprises precision-press-molding a lens-shaped window material glass made of a glass having an average linear expansion coefficient of $120\times10^{-7}/°$ C. to $180\times10^{-7}/°$ C. at a temperature of 100 to 300° C. and contains Cu and phosphorus oxide in which a wavelength which exhibits a transmittance of 50% is 630 nm or less in terms of a spectral transmittance at a wavelength of 400 to 700 nm when the glass has a thickness of 0.5 mm wherein the glass contains, by cationic %, 23 to 41% of $P^{5+}$, 4 to 16% of $Al^{3+}$, 11 to 40% of $Li^{30}$, 3 to 13% of $Na^+$, 12 to 53% of $R^{2+}$ ($R^{2+}$ stands for $Mg^{2+}$, $Ca^{2+}$, $Sr^{2+}$, $Ba^{2+}$ or $Zn^{2+}$) and 2.6 to 4.7% of $Cu^{2+}$ and contains $F^-$ and $O^{2-}$ as anionic components.

12. The glass window for a semiconductor package as recited in claim 7, which is a precision press-molded product.

* * * * *